United States Patent
Zhang et al.

(10) Patent No.: US 11,767,435 B2
(45) Date of Patent: Sep. 26, 2023

(54) ANTI-REFLECTION COATING COMPOSITION AND USE THEREOF

(71) Applicant: PhiChem Corporation, Shanghai (CN)

(72) Inventors: Yun Zhang, Shanghai (CN); Jiaqi Zhao, Shanghai (CN); Fanjie Xu, Shanghai (CN)

(73) Assignee: PhiChem Corporation, Shanghai (CN)

( * ) Notice: Subject to any disclaimer, the term of this patent is extended or adjusted under 35 U.S.C. 154(b) by 0 days.

(21) Appl. No.: 17/560,776

(22) Filed: Dec. 23, 2021

(65) Prior Publication Data

US 2023/0203319 A1    Jun. 29, 2023

(30) Foreign Application Priority Data

Dec. 23, 2021 (CN) .......................... 202011539567.8

(51) Int. Cl.
| | |
|---|---|
| C09D 5/00 | (2006.01) |
| G03F 7/09 | (2006.01) |
| C08L 61/26 | (2006.01) |
| C08K 5/00 | (2006.01) |
| C08K 5/3492 | (2006.01) |
| C08F 220/32 | (2006.01) |
| C08F 220/20 | (2006.01) |
| C08F 4/32 | (2006.01) |

(52) U.S. Cl.
CPC .............. *C09D 5/006* (2013.01); *C08F 4/32* (2013.01); *C08F 220/20* (2013.01); *C08F 220/325* (2020.02); *C08K 5/0041* (2013.01); *C08K 5/34922* (2013.01); *C08L 61/26* (2013.01); *G03F 7/091* (2013.01)

(58) Field of Classification Search
CPC ....................................................... G03F 7/091
See application file for complete search history.

(56) References Cited

U.S. PATENT DOCUMENTS

| | | | |
|---|---|---|---|
| 5,919,599 A | 7/1999 | Meador et al. | |
| 6,156,479 A * | 12/2000 | Meador ............... | C08F 8/00 |
| | | | 430/271.1 |
| 7,666,575 B2 | 2/2010 | Kim et al. | |
| 2008/0014529 A1* | 1/2008 | Oberlander ............ | G03F 7/091 |
| | | | 430/270.1 |
| 2008/0176165 A1 | 7/2008 | Xiang et al. | |
| 2008/0286689 A1 | 11/2008 | Zhuang et al. | |
| 2009/0148789 A1 | 6/2009 | Amara et al. | |
| 2012/0034419 A1* | 2/2012 | Washburn ............. | G03F 7/091 |
| | | | 427/523 |
| 2013/0095325 A1 | 4/2013 | Hiraki et al. | |

FOREIGN PATENT DOCUMENTS

| | | |
|---|---|---|
| CN | 101539722 A | 9/2009 |
| CN | 101583907 A | 11/2009 |
| CN | 101959980 A | 1/2011 |
| CN | 103353706 A | 10/2013 |
| CN | 110128904 A | 8/2019 |
| JP | 2004126161 A | 4/2004 |
| JP | 2011230415 A | 11/2011 |

OTHER PUBLICATIONS

China National Intellectual Property Administration, First office action of Chinese application No. 202011539567.8 dated Jan. 29, 2022, which is foreign counterpart application of this US application.

China National Intellectual Property Administration, Notification to grant patent right for invention of Chinese application No. 202011539567.8 dated May 11, 2022, which is foreign counterpart application of this US application.

First office action of Chinese application No. 202011539567.8 dated Aug. 16, 2021.

Notification of Reason for Refusal of Korean application No. 10-2021-0186008 dated Nov. 2, 2022.

\* cited by examiner

*Primary Examiner* — Duane Smith
*Assistant Examiner* — Nicholas E Brown
(74) *Attorney, Agent, or Firm* — Knobbe Martens Olson & Bear LLP

(57) ABSTRACT

Provided is an anti-reflection coating composition. The anti-reflection coating composition includes an active component and a solvent B. The active component includes a matting resin A, a catalyst C, and a crosslinking agent D. The weight average molecular weight of the matting resin A is less than or equal to 20000. Also provided is use of the anti-reflection coating composition.

20 Claims, 4 Drawing Sheets

US 11,767,435 B2

ANTI-REFLECTION COATING COMPOSITION AND USE THEREOF

CROSS-REFERENCE TO RELATED APPLICATION

This application claims priority to Chinese Patent Application No. 202011539567.8, filed on Dec. 23, 2020 and entitled "ANTI-REFLECTION COATING COMPOSITION, AND USE THEREOF," the disclosure of which is herein incorporated by reference in its entirety.

TECHNICAL FIELD

The present disclosure relates to the field of photolithographic technologies, and in particula relates to an anti-reflection coating composition and use thereof.

BACKGROUND

A bottom anti-reflection coating (BARC) layer is a coating layer disposed between a photoresist and a substrate, and is capable of effectively eliminating interfering standing waves formed from the reflection of light. The BARC layer can increase the focal length and the range of exposure energy, reduce the influence of substrate geometry difference on the critical dimension (CD) uniformity, decrease the gap caused by the scattering of reflected light, and relieve the swing curve effect and undercut effect caused by different photoresist thicknesses due to the configuration of the substrate. Currently, the BARC layer is a widely used solution for eliminating reflectivity.

SUMMARY

Embodiments of the present disclosure provide an anti-reflection coaling composition and use thereof.

In one aspect, an anti-reflection coating composition is provided, wherein the anti-reflection coating composition includes: an active component and a solvent B;
   wherein the active component includes a matting resin A, a catalyst C, and a crosslinking agent D, and a weight average molecular weight of the matting resin A is less than or equal to 20000.

In some possible implementations, a raw material for preparing the matting resin A includes a matrix resin and a chromophoric compound.

In some possible implementations, the matrix resin includes at least one member selected from a group consisting of acrylic resin, phenolic resin, polyamide, polyimide, polyfluorene, polyfluorene derivatives, polysiloxane, polysilane, or polycarbosilane.

In some possible implementations, the matrix resin includes acrylic resin.

In some possible implementations, polymerization monomers of the acrylic resin include same acrylate monomers.

In some possible implementations, polymerization monomers of the acrylic resin include different acrylate monomers.

In some possible implementations, the polymerization monomers of the acrylic resin include at least one of epoxy-containing or hydroxyl-containing acrylate monomers A21, and at least one of hydroxyl-containing acrylate monomers A22, and wherein A21 and A22 are different.

In some possible implementations, the polymerization monomers of the acrylic resin include at least one of epoxy-containing or hydroxyl-containing acrylate monomers A21, and at least one of acrylate monomers A23 free of both hydroxyl group and epoxy group.

In some possible implementations, a molar ratio of A21 to A22 is between 1:0.1 and 1:5.

In some possible implementations, a molar ratio of A21 to A23 is between 1:0.1 and 1:5.

In some possible implementations, a molar ratio of A21 to the chromophoric compound is between 1:0.8 and 1:1.

In some possible implementations, the chromophoric compound includes at least one member selected from a group consisting of naphthalene or derivatives thereof, anthracene or derivatives thereof, coumarin or derivatives thereof, fluorescein or derivatives thereof, rhodamine, eosin, perylene or derivatives thereof, fluorene or derivatives thereof, stilbene or derivatives thereof, or phenanthrene or derivatives thereof.

In some possible implementations, the catalyst C is an organic acid salt.

In some possible implementations, the organic acid salt includes at least one member selected from a group consisting of p-toluenesulfonate, dodecylbenzene sulfonate, oxalate, phthalate, or naphthalene sulfonate.

In some possible implementations, the crosslinking agent D includes at least one member selected from a group consisting of glycoluril-aldehyde resin, melamine-aldehyde resin, benzoguanamine-aldehyde resin, or urea-aldehyde resin.

In some possible implementations, the crosslinking agent D is a mixture of a first crosslinking agent D1 and a second crosslinking agent D2;
   wherein the first crosslinking agent D1 includes at least one member selected from a group consisting of melamine-aldehyde resin, or benzoguanamine-aldehyde resin; and
   the second crosslinking agent D2 includes at least one member selected from a group consisting of glycoluril-aldehyde resin, or urea-aldehyde resin.

In some possible implementations, a weight ratio of the second crosslinking agent D2 to the first crosslinking agent D1 is between 1:1 and 9:1.

In some possible implementations, a weight percentage of the active component in the anti-reflection coating composition ranges from 1 wt % to 20 wt %, and a weight percentage of the solvent B in the anti-reflection coating composition ranges from 80 wt % to 99 wt %.

In some possible implementations, a weight percentage of the matting resin A in the active component ranges from 50 wt % to 95 wt %;
   a weight percentage of the catalyst C in the active component ranges from 1 wt % to 20 wt %; and
   a weight percentage of the crosslinking agent D in the active component ranges from 3 wt % to 40 wt %.

In another aspect, use of the anti-reflection coating composition described above is provided.

DETAILED DESCRIPTION

Figure 1:
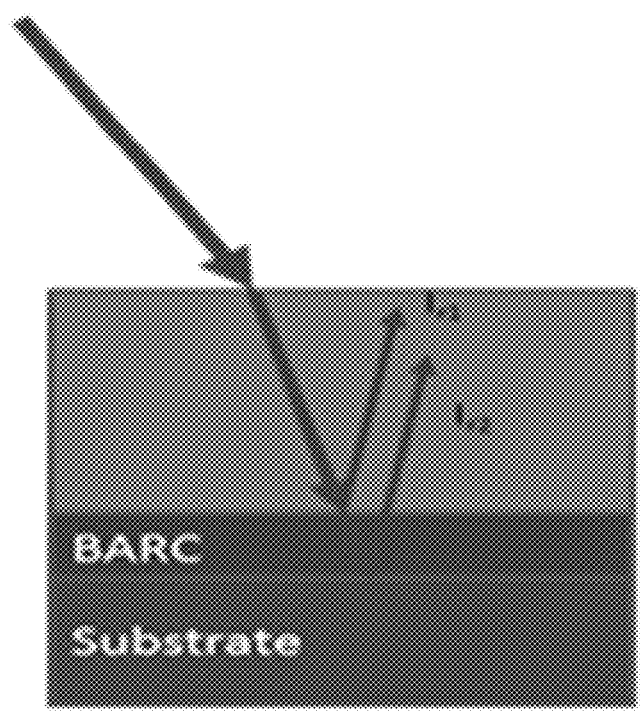
FIG. 1 is a schematic diagram showing the mechanism of an anti-reflection layer.

The content of the present disclosure may be more readily understood with reference to the following detailed description of the illustrative embodiments and the examples as provided. Unless otherwise defined, all technical or scientific terms used in the present disclosure have the same meaning as the ordinary meaning understood by persons of ordinary skill in the art to which the present disclosure belongs. If a definition of a specific term disclosed in the related art is not consistent with the definition provided in the present disclosure, the definition of the term provided in the present description shall prevail.

The expression "be prepared from" is synonymous with the term "include/comprise". The terms "comprise," "include," "possess," "contain," or any other variation thereof are intended to express a non-exclusive inclusion. For example, the composition, step, method, article, or apparatus including the listed elements is not necessarily limited to those elements, but may include other elements not expressly listed or inherent to the composition, step, method, article, or apparatus.

The expression "consist of . . . " excludes any unstated elements, steps or components. If used in the claims, the expression shall make the claims to express a close-ended inclusion such that the claims do not include materials other than the materials described, except for the related conventional impurities. When the expression "consist of . . . " is in a clause of a claim rather than immediately follows the subject matter, the expression merely defines the elements described in the clause; other elements are not excluded from the entire claims.

Where an amount, concentration, or other value or parameter is expressed in a range, an exemplary range, or a series of ranges defined by upper limit and lower limit exemplary values, this should be understood to specifically disclose all ranges formed by any pairing of any upper limit value or exemplary value with any lower limit value or exemplary value, whether the specific range is separately disclosed or not. For example, when the range "1 to 5" is disclosed, the described range should be interpreted to include the ranges "1 to 4," "1 to 3," "1 to 2," "1 to 2, and 4 to 5", "1 to 3, and 5" and the like. Where a numerical range is described herein, unless otherwise described, the range is intended to include both endpoints and all integers and fractions within this range.

The singular form of an object also encompasses the plural numbers of the objects, unless otherwise clearly indicated in the context. The terms "optional" or "any of" mean that the subsequently described event or situation may occur or may not occur, and the description includes both situations where the event occurs and the event does not occur.

The approximating term used in the specification and claims is applied to modify the quantity, indicating that the present disclosure is not limited to the specific quantity, but further includes acceptable modified values that are close to the quantity but do not lead to changes in related basic functions. Accordingly, the terms "about," "approximately," and the like, when modifying a value, indicating that the present disclosure is not limited to the precise value. In some embodiments, the approximating term may correspond to the precision of the instrument for measuring the value. In the specification and claims, differently defined ranges may be combined and/or interchanged, and if not otherwise indicated, these ranges include all the sub-ranges contained therebetween.

In addition, the indefinite articles "a" and "an," prior to an element or component of the present disclosure put no limitation on the number of element(s) or component(s) (i.e., the number of occurrences). Thus, the terms "a" or "an" should be understood to include one or at least one, and the singular forms of the elements or components also include the plural forms of the elements or components, unless it can be clearly determined that the number should be only one.

The present disclosure is further described through specific embodiments, but is not limited to the specific embodiments hereinafter.

In the photolithography process for fabricating an integrated circuit, due to the optical reflection of the substrate, the light intensity (short for $I_z$) exhibits a sinusoidal periodic variation along the depth direction of the photoresist layer, resulting in the appearance of sinusoidal fluctuation at the sidewall of the photoresist pattern and poor controllability of the critical dimension. The breaking film energy of the photoresist ($E_{th}$) and the optimal exposure energy ($E_{op}$) exhibit sinusoidal periodic fluctuations with the increase of thickness of the photoresist layer, resulting in a low controllability on exposure energy of the photoresist layer which has a non-flat surface (the breaking film energy of the photoresist refers to the lowest exposure amount corresponding to the case where the film thickness in the exposure region after developing is 0, and the optimal exposure energy refers to the corresponding exposure amount that can copy a pattern onto the photoresist with a 1:1 ratio). Ultraviolet light is reflected at the top or side surface of the photoresist pattern, to a dark region of an aerial image, causing a photoresist pattern defect. With the decrease of the critical dimension, the line width non-uniformity and photoresist pits caused by a high reflection layer, and the lateral photochemical reaction caused by the scattering of ultraviolet light in the photoresist layer due to solid particles, become more and more unacceptable.

A bottom anti-reflection coating (BARC) layer is a coating layer disposed between a photoresist and a substrate, and is capable of effectively eliminating interfering standing waves formed from the reflection of light. The BARC layer can increase the focal length and the range of exposure energy, reduce the influence of substrate geometry difference on the critical dimension (CD) uniformity, decrease the gap caused by the scattering of reflected light, and relieve the swing curve effect and undercut effect caused by different photoresist thicknesses due to the configuration of the substrate. Currently, the BARC layer is a widely used solution for eliminating reflectivity.

As shown in FIG. 1: prior to coating the photoresist on the substrate, a BARC layer with a strong absorption of the light of the photolithographic wavelength is first coated on the substrate, and by controlling the thickness of the BARC layer, the reflected light from the interface between the photoresist and the BARC layer and the reflected light from the interface between the BARC layer and the substrate generate a destructive interfere, thereby decreasing the total intensity of the reflected light.

After coating the photoresist over the BARC layer, the photoresist needs to be exposed and developed, and then typically, the BARC layer in the exposed region is etched so that the photoresist pattern can be transferred to the substrate. The BARC layer includes an inorganic BARC layer and an organic BARC layer. The preparation process of the organic BARC layer is relatively simple, and the organic BARC layer is easy to etch. Therefore, the organic BARC is more wildly applied in the semiconductor photolithography process, particularly in deep ultraviolet (DUV) photolithography process.

The raw material for preparing the organic BARC includes a mailing resin that can absorb a specific type of light. Further, for increasing the strength of the BARC layer, reducing the solubility of the BARC layer in the solvent, and preventing the photoresist layer from releasing during the lithography process, the raw material for preparing the organic BARC layer may further include a crosslinking agent and an acid catalyst. The BARC layer in the exposed region needs to be removed through an etching process. It is desired that the BARC layer has a larger extinction coefficient, such that a thinner anti-reflection layer can be employed. In this case, the etching time can be shortened, and the BARC layer is easier to clear. In addition, the etching process may generally etch the photoresist material to some extent. In this case, if the etching rate of the BARC is similar to or less than the etching rate of the photoresist coated over the BARC layer, the photoresist pattern may be damaged or may not be able to be accurately transferred to the substrate. Therefore, the etching rate of the BARC layer is expected to be higher compared with the photoresist, thus, the BARC layer can be quickly etched, and a shorter etching time is allowed, such that the BARC layer can be effectively etched but the photoresist layer would not be excessively damaged. In this case, the BARC layer with a relatively high etching rate would be more suitable for use in a thinner photoresist layer, thereby facilitating the production of a high-resolution photoresist pattern.

However, the BARC layer in the related art at least includes the following technical problems.

(1) The extinction coefficient K of the BARC layer is less than 0.4. In this case, the thickness of the BARC layer needs to be large enough to eliminate the standing waves and the interference effect generated in the photolithographic process, which may in turn result in the BARC layer difficult to remove. Further, when using a thick BARC layer in the photolithographic process of a thin photoresist layer, the etching time will be prolonged, which however may lead to the over-etching of the photoresist layer in an unexposed region, such that the photoresist cannot protect the pattern effectively and the generation of a high-resolution photoresist pattern will fail.

(2) The etching rate of the BARC layer is relatively low, causing excessive loss of the photoresist layer in the unexposed region during the etching process, which in turn causes the damage to the photoresist pattern or inaccurate transfer to the substrate.

(3) In the process of preparing the BARC layer, an acid is employed as a catalyst. The acid catalyst has a poor storage stability, and may form a residue upon plasma etching, such that the defective rate of the substrate is relatively high, and the service life of the device used in the spin coating and baking process will be shorten.

One aspect of the present disclosure provides an anti-reflection coating composition including an active component and a solvent B. The active component includes a matting resin A, a catalyst C, and a crosslinking agent D, wherein a weight average molecular weight of the matting resin A is less than or equal to 20000.

In some embodiments, the coating composition includes, by weight, from 1 wt % to 20 wt % of active component and from 80 wt % to 99 wt % of solvent B.

The weight percentage of the matting resin A in the active component ranges from 50 wt % to 95 wt %;
the weight percentage of the catalyst C in the active component ranges from 1 wt % to 20 wt %;
and
the weight percentage of the crosslinking agent D in the active component ranges from 3 wt % to 40 wt %.

Active Component

The active component refers to all components in the anti-reflection coating composition other than the solvent, and includes a matting resin A, a catalyst C, and a crosslinking agent D. For example, in the present disclosure, the weight percentage of the active component in the coating composition may be 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, and the like. In an exemplary embodiment, the active component accounts for 2 wt % to 10 wt % of the coating composition in the present disclosure.

In some embodiments, the active component includes from 50 wt % to 95 wt % of matting resin A, from 1 wt % to 20 wt % of catalyst C, and from 3 wt % to 40 wt % of crosslinking agent D.

For example, the weight percentage of the matting resin A in the active component may be 50 wt %, 55 wt %, 60 wt %, 65 wt %, 70 wt %, 75 wt %, 80 wt %, 85 wt %, 90 wt %, 95 wt %, and the like.

For example, the weight percentage of catalyst C in the active component ay be 1 wt %, 2 wt %. 3 wt %. 4 wt %. 5 wt %. 6 wt %. 7 wt %, 8 wt %. 9 wt %. 10 wt %, 11 wt %, 12 wt %, 13 wt %. 14 wt %, 15 wt %, 16 wt %, 17 wt %, 18 wt %, 19 wt %, 20 wt %, and the like.

For example, the weight percentage of the crosslinking agent D in the active component may be 3 wt %, 6 wt %, 0 wt %, 12 wt %, 15 wt % 18 wt %, 20 wt %, 22 wt %, 25 wt %, 28 wt %, 30 wt %, 32 wt %, 35 wt %, 38 wt %, 40 wt %, and the like.

Matting Resin A

The matting resin A used in the embodiments of the present disclosure not only functions as a primary film-forming material in the coating composition so as to provide a good film-forming performance, but also has a high light absorption performance. by absorbing the exposure light arriving at the bottom of the photoresist during the photolithography process, the matting resin A can prevent reflection or diffraction of the light from happening in the photoresist, thereby ensuring the quality of the photoresist pattern.

In some embodiments, the weight percentage of the matting resin A in the active component ranges from 70 wt % to 90 wt %.

In some embodiments, the weight average molecular weight of the matting resin A is less than or equal to 20,000, such as from 6000 to 20,000, including, but not limited to: 6000, 7000, 8000, 9000, 10000, 11000, 12000, 13000, 14000, 15000, 16000, 17000, 18000, 19000, 20000, and the like.

In some embodiments, the matting resin A provided in the present disclosure is prepared from a matrix resin and a chromophoric compound.

For example, the matrix resin includes, but is not limited to: acrylic resin, phenolic resin, polyamide, polyimide, polyfluorene, polyfluorene derivatives, polysiloxane, polysilane, polycarbosilane, and the like.

For example, the chromophoric compound includes, but is not limited to: anthracene or derivatives thereof (derivatives of anthracene may for example be 2-anthracenecarboxylic acid, 9-anthracenecarboxylic acid, 2-vinylanthracene, 9-vinylanthracene, 9-hydroxymethylanthracene, and the like), coumarin or derivatives thereof (derivatives of coumarin may be, for example, 4-hydroxycoumarin, 7-hydroxycoumarin, etc.), fluorescein or derivatives thereof (derivatives of fluorescein may be, for example, fluorescein isothiocyanate, and the like), rhodamine (rhodamine B, rhodamine 6G, and the like), eosin (eosin Y, eosin B, and the like), perylene or derivatives thereof (derivatives of perylene may be, for example, 3,4,9,10-perylenetetracarboxylic dianhydride, and the like), fluorene or derivatives thereof (derivatives of fluorene may be, for example, 9-fluorenol, 1-fluorenecarboxylic acid, 9-fluorenecarboxylic acid, 9,9-bis(4-hydroxyphenyl)fluorene, and the like), and stilbene or derivatives thereof (stilbene derivatives may be, for example, 4,4'-stilbenedicarboxylic acid, and the like).

In some embodiments, the matrix resin includes the acrylic resin, which can further facilitate the great film-forming performance and coating stability of the coating composition.

In some embodiments, the chromophoric compound includes anthracene or derivatives thereof. Further, the chromophoric compound is an anthracene derivative.

The inventors have found that the matting resin A, prepared by bonding a chromophoric group in the chromophoric compound with a main chain or side chain of the matrix resin, possesses a great light absorption performance, and when the matting resin A is applied to the coating composition of the embodiments of the present disclosure, the anti-reflection capability of the composition can be enhanced.

For example, when adopting anthracene derivative as the chromophoric compound and adopting acrylic resin as the matrix resin to prepare the matting resin, and then preparing a BARE layer by mixing the matting resin with a crosslinking agent D, a catalyst C and a solvent B of the embodiments of the present disclosure, the BARC layer can efficiently absorb light radiation ranging from 100 nm to 300 nm, especially has a greater light absorption performance and a higher extinction coefficient (the extinction coefficient can be greater than 0.4, further can be greater than 0.5) at the wavelength of 248 nm. As such, by using a thinner BARC layer, the function of eliminating interference effect, standing waves, and reflective notching in the photoresist film can be realized, so that a photoresist pattern with high quality can be obtained. Thus, such BARE layer is particularly suitable for enabling a thin photoresist layer to generate a photoresist pattern with a high resolution. In addition, a thinner BARC layer makes the etching time shorter and is easy to be cleaned, which can avoid excessive loss of the photoresist layer in the unexposed region during the etching process. Therefore, the pattern can be smoothly transferred from the photoresist to the substrate, thereby obtaining a photoresist pattern with a high quality.

In some examples, the chromophoric compound is a carboxyl-containing anthracene derivative. For example, the carboxyl-containing anthracene derivative may include, but is not limited to: 2-anthracenecarboxylic acid, 9-anthracenecarboxylic acid and derivatives thereof, and derivatives of 2-anthracenecarboxylic acid or derivatives of 9-anthracenecarboxylic acid may be, such as, halogen, alkyl, alkoxy, nitrile, or all oxycarbonyl substituted 2-anthracenecarboxylic acid or 9-anthracenecarboxylic acid. In some examples, the chromophoric compound is at least one of 2-anthracenecarboxylic acid, or 9-anthracenecarboxylic acid.

In some implementations, the polymerization monomer of the acrylic resin may include at least one kind of acrylate monomer. That is, the acrylic resin may be prepared by polymerizing at least one kind of acrylate monomers. In some cases, the acrylic resin may be polymerized from same acrylate monomers, or in some cases, the acrylic resin may be polymerized from different kinds of acrylate monomers, for example, from two or more different acrylate monomers.

For example, the polymerization monomer of the acrylic resin may be same kind of acrylate monomer (i.e., the acrylic resin is polymerized from same acrylate monomers, and the same acrylate monomers here may be referred to as acrylate monomer A1), or the polymerization monomer of the acrylic resin may include different kinds of acrylate monomers (i.e., the acrylic resin may be polymerized from two or more different acrylate monomers, and the different acrylate monomers here may be referred to as acrylate monomers A2).

In some implementations, the polymerization monomer of the acrylic resin may include acrylate monomer that is capable of reacting with carboxyl group. In some examples, the acrylate monomer that is capable of reacting with carboxyl group may be an epoxy-containing or hydroxyl-containing acrylate monomer. In some examples, the epoxy-containing acrylate monomer may include at least one of: glycidyl methacrylate (GMA), glycidyl acrylate, or 4-hydroxybutyl acrylate glycidyl ether, and may include, such as, glycidyl methacrylate (GMA), and glycidyl acrylate.

In some examples, the hydroxyl-containing acrylate monomer may include at least one of: hydroxyethyl acrylate, hydroxypropyl acrylate, hydroxyethyl methacrylate, or hydroxypropyl methacrylate (FIRMA), and may include, such as, hydroxypropyl methacrylate (FIRMA), and hydroxy ethyl methacrylate.

In some implementations, the polymerization monomer of the acrylic resin may further include an acrylate monomer free of both epoxy group and hydroxyl group. In some examples, the acrylate monomer free of both epoxy group and hydroxyl group may include at least one of: methyl methacrylate, methyl acrylate, isobornyl methacrylate, isobornyl acrylate, n-butyl methacrylate, benzyl methacrylate, t-butyl acrylate, t-butyl methacrylate, or cyclohexyl acrylate.

In some implementations, the polymerization monomer of the acrylic resin is a same kind of acrylate monomers (the acrylate monomer A1)), i.e., the acrylic resin is a polymer of same acrylate monomers. The acrylate monomer A1 is selected from the acrylate monomers capable of reacting with carboxyl group. In some implementations, the acrylate monomer A1 is selected from one of the above epoxy-containing acrylate monomers. In some other implementations, the acrylate monomer A1 is selected from one of the above hydroxyl-containing acrylate monomers. In some examples, the acrylate monomer A1 includes, but is not limited to: glycidyl methacrylate (GMA), glycidyl acrylate, hydroxypropylmethacrylate, and hydroxyethyl methacrylate.

In some other implementations, the polymerization monomer of the acrylic resin of the present disclosure includes different acrylate monomers (the acrylate monomers A2), i.e., the acrylic resin is a polymer formed by polymerizing different acrylate monomers (the acrylate monomers A2).

In some examples, the acrylate monomers A2 include at least one epoxy-containing or hydroxyl-containing acrylate monomer A21, and at least one hydroxyl-containing acrylate monomer A22. For example, the acrylate monomers A2 may include one of the epoxy-containing or hydroxyl-containing acrylate monomer A21, and one hydroxyl-containing acrylate monomer A22. It is noted that when A21 is a hydroxyl-containing acrylate monomer, the hydroxyl-containing acrylate monomer A21 is different from the hydroxyl-containing acrylate monomer A22.

In some examples, a molar ratio of the epoxy-containing or hydroxyl-containing acrylate monomer A21 to the hydroxyl-containing acrylate monomer A22 is between 1:0.1 and 1:5. For example, the molar ratio of the epoxy-containing or hydroxyl-containing acrylate monomer A21 to the hydroxyl-containing acrylate monomer A22 includes, but is not limited to: 10:1, 5:1, 10:3, 5:2, 2:1, 5:3, 10:7, 5:4, 10:9, 1:1, 1:2, 1:3, 1:4, 1:5, and the like. Further, the molar ratio may be between 1:0.33 and 1:3.

In some exemplary implementations, the acrylate monomers A2 include at least one epoxy-containing or hydroxyl-containing acrylate monomer A21, and at least one acrylate monomer A23 free of hydroxyl group and epoxy group, i.e., at least one acrylate monomer A23 that neither contains hydroxyl group nor epoxy group. In some examples, the acrylate monomers A2 include one of the epoxy-containing or hydroxyl-containing acrylate monomer A21, and one acrylate monomer A23 that neither contains hydroxyl group nor epoxy group.

In some examples, the molar ratio of the epoxy-containing or hydroxyl-containing acrylate monomer A21 to the acrylate monomer A23 that neither contains hydroxyl group nor epoxy group is between 1:0.1 and 1:5, including, but not limited to: 10:1, 5:1, 10:3, 5:2, 2:1, 5:3, 10:7, 5:4, 10:9, 1:1, 1:2, 1:3, 1:4, 1:5. Further, the molar ratio may be between 1:0.33 and 1:3.

When different acrylate monomers are used for preparing the matting resin A, the chromophoric compound is bonded to, via a carboxylic ester bond, the structural segment formed from the epoxy-containing or hydroxyl-containing acrylate monomer A21 in the matrix resin. In some examples, the molar ratio of the epoxy-containing or hydroxyl-containing acrylate monomer A21 to the chromophoric compound is between 1:0.8 and 1:1. For example, at least 80% of the molar number of the structural segments formed from the epoxy-containing or hydroxyl-containing acrylate monomer A21 in the matrix resin are selected to bond the chromophoric compounds, at least 80% of the molar number of the structural segments formed from the epoxy-containing or hydroxyl-containing acrylate monomer A21 in the matrix resin are selected to bond the chromophoric compounds, and 100% of the molar number of the structural segments formed from the epoxy-containing or hydroxyl-containing acrylate monomer A21 in the matrix resin are selected to bind the chromophoric compounds.

When the molar ratio of the epoxy-containing or hydroxyl-containing acrylate monomer A21 to the chromophoric compound is within the aforementioned range, the chromophoric compound can be prevented from dispersing in the resin, thereby avoiding acidic species from entering the photoresist during the photolithography process using the formed BARC layer, and effectively preventing the appearance of footing profiles at the bottom of the photoresist pattern.

The molecular weight of the matting resin A may be suitably varied based on the thickness range of the coating. In some embodiments, the weight average molecular weight of the matting resin A may range from 6000 to 20,000. When the molecular weight of the matting resin A is within this range, it is beneficial for the BARC layer formed after the crosslinking reaction of the anti-reflection coating composition to achieve an excellent quality and have a great resistance to the photoresist solvent, which can effectively prevent partial BARC layer from being dissolved by the photoresist solvent after the coating of the photoresist, such that the BARC layer has the function of fully eliminating the standing waves and simultaneously ensuring the uniformity in the coating of the photoresist to achieve a greater uniformity at the surface of the photoresist pattern. When the molecular weight of the matting resin A is greater than 20,000, the time used in removing the BARC layer in the plasma asking removal process will be prolonged, and it is possible to form unremovable residue which may in turn result in a wafer detect.

It has been found that by adopting the matting resin A, the catalyst, and the crosslinking agent as mentioned above to prepare the anti-reflection coating composition, the coating formed from the anti-reflection coating composition can have an extinction coefficient K ranging from 0.4 to 0.8 at the 248 nm wave band. In addition, the coating further possesses an improved etching performance, which can allow for a shorter etching time, so that the excessive loss of the photoresist film in the unexposed region can be avoided during the etching process, and the complete transfer of the image onto the substrate can be ensured, thereby obtaining a great photoresist pattern. In addition, such coating that only requires a relatively short etching time may find applications in thin photoresist layers, and can facilitate the generation of a high-resolution photoresist pattern.

In the embodiments of the present disclosure, the weight average molecular weight is defined as the molecular weight based on the statistical average by weight of the molecules, which can be determined by gel permeation chromatography. The extinction coefficient is defined as a measure for evaluating the magnitude of absorbing light of a test substance, which may be obtained through ellipsometer. The matting resin A in the present disclosure may be prepared by any method known in the art, such as solution polymerization, emulsion polymerization, and the like, which is not specifically set forth here.

Catalyst C

In the embodiments of the present disclosure, the catalyst refers to a substance that can generate a protic acid upon being heated, such that the cross-linking and curing reaction between resin and crosslinking agent can be facilitated. In the embodiments of the present disclosure, when the weight percentage of the catalyst C in the active component ranges from 1 wt % to 20 wt %, it is beneficial to facilitate the sufficient cross-linking and curing reaction between the matting resin A and the crosslinking agent D, such that the formed coating is more resistant to the solvent of the photoresist, and after the photoresist is coated, the BARC layer that is still partially cured would not be cleaned by the photoresist solvent, such that the contact surface of the photoresist and the BARC layer is more uniform, and the uniformity of the surface of the finally obtained photoresist pattern is excellent. In addition, by adopting the catalyst C within the above content range, it can prevent the anti-reflection coating composition from decomposing and generating the protic acid during the storage prior to use, thereby improving the storage stability of the anti-reflection coating composition. In some examples of the present disclosure, the weight percentage of the catalyst C in the active component ranges from 2 wt % to 5 wt %, such as, 2 wt %, 3 wt %, 4 wt %. 5 wt %, and the like.

In some implementations, the catalyst C may include an organic acid salt. By adopting the organic acid salt as the catalyst C, it can prevent excessive volatiles from being sublimated during the thermal curing of the coating composition of the present disclosure. In some examples, the organic acid salt of the present disclosure may include, but is not limited to: p-toluenesulfonate, dodecyl benzene sulfonate, oxalate, phthalate, naphthalene sulfonate, and the like. The organic acid salt in the embodiments of the present disclosure may be a sodium salt, a potassium salt, an amine salt, and the like of an organic acid. For example, the catalyst C of the present disclosure may be p-toluenesulfonate.

It has been found that although both organic acids and organic acid salts can act as the catalyst C to generate a protic acid under a heating condition to provide an effective catalytic function, organic acids such as p-toluenesulfonic acid, oxalic acid, and the like, may also undergo a slow catalytic reaction at ambient temperature, resulting in the storage period of the coating composition shorter. Therefore, the coating composition employing an organic acid as a catalyst C may undergo a slow catalytic reaction when being stored at the ambient temperature, resulting in a local curing to form a gel, which will lead to the non-uniformity of the coating in the subsequent process, and affect the subsequent photoresist application process. By adopting an organic acid salt as the catalyst C, the anti-reflection coating composition provided in the embodiments of the present disclosure will only undergo protic acid catalyzed crosslinking reaction upon being baked under a high temperature, such that the anti-reflection coating composition can have a better storage stability.

It can be seen that, compared with conventional p-toluene sulfonic acid or other protonic acid catalysts, organic acid salts, such as p-toluenesulfonate, are not only effective in providing the catalytic function, but also effective in ensuring that the anti-reflection coating composition can maintain a longer and more stable storage before use. In addition, upon heating and cross-linking, the organic acid salts may gradually generate protic acid, which process can reduce the release of the sublimation volatile species compared with the organic acids (the release of the sublimated species may cause voids and the like in the coating, and further result in a poor compactness of the coating), thereby causing the BARC layer to be more uniform and dense, and increasing the stability of the BARC layer. Thus, the BARC possesses better elution resistance and thus can withstand the elution of the photoresist solvent, and can be prevented from mixing with the photoresist material.

Crosslinking Agent D

In the embodiments of the present disclosure, the crosslinking agent D can interact with other components in the anti-reflection coating composition and thus impart a thermal crosslinking capability to the anti-reflection coating composition. After the resulted composition is applied and heated or baked, a crosslinking reaction occurs. As a result, the anti-reflection coating as finally formed has a great etch resistance and a great adhesion to the photoresist coating coated on the anti-reflection coating, and would not have an adverse effect due to the transfer of chemical substances, such as acids or the solvents.

In some implementations, the crosslinking agent D used in the present disclosure may include a substance capable of reacting with a functional group, such as hydroxyl group, in the matting resin A, for example, the crosslinking agent D may include amino resin, isocyanate, and the like.

In some examples, the crosslinking agent D used in the present disclosure is amino resin, wherein the amino resin is prepared from a polycondensation reaction of an amino-containing compound and aldehyde (the aldehyde here may be formaldehyde, acetaldehyde, and the like). For example, the amino resin may include, but is not limited to: a glycoluril-aldehyde resin, a melamine-aldehyde resin, a benzoguanamine-aldehyde resin, a urea-aldehyde resin, and the like.

The glycoluril-aldehyde resin is prepared from the polycondensation reaction of glycoluril and aldehyde, the glycoluril-aldehyde resin may include, but is not limited to: a full hydroxymethyl glycoluril-aldehyde resin (such as CYMEL 1172), a butylether glycoluril-aldehyde resin (such as CYMEL 1170), and the like.

The melamine-aldehyde resin is prepared from a polycondensation reaction between melamine and aldehyde, and in some examples, the melamine-aldehyde resin may include at least one of: a methylated melamine-aldehyde resin, a butylated melamine-formaldehyde resin, or hybrid etherified melamine-aldehyde resins.

In some examples, the methylated melamine-aldehyde resin includes at least one of a high-methylated melamine-aldehyde resin, a high-iminomethylated melamine-aldehyde resin, or a partially methylated melamine-aldehyde resin.

The high-methylated melamine-aldehyde resin is a high-alkylated melamine-aldehyde resin, such as a methylated hexamethoxy melamine-aldehyde resin, and the methylated hexamethoxy melamine-aldehyde resin may include, but is not limited to: CYMEL 300, CYMEL 303LF, CYMEL 303ULF, CYMEL 304, CYMEL 308, CYMEL 350, CYMEL XW 3106, and the like.

The high-iminomethylated melamine-aldehyde resin is a partially methoxylated or highlalkylated melamine-aldehyde resin, and the high-iminomethylated melamine-aldehyde resin includes, but is not limited to: CYMEL 323, CYMEL 325, CYMEL 327, CYMEL 385, and the like.

The partially methylated melamine-aldehyde resin is a high-methoxylated or partially alkylated resin, and the partially methylated melamine-aldehyde resin includes, but is not limited to: CYMEL 370, CYMEL 373, CYMEL 380, and the like.

In some examples, the butylated melamine-formaldehyde resin includes at least one of: a n-butylated melamine-aldehyde resin, a high-n-butylated melamine-aldehyde resin, a high-imino-n-butylated melamine-aldehyde resin, or an iso-butylated melamine-aldehyde resin.

The n-butylated melamine-aldehyde resin includes, but is not limited to: CYMEL 243-3, CYMEL 247-10, and the like. The high-n-butylated melamine-aldehyde resin distinguishes from the high-methylated hexamethylol melamine (HMMM) only in that it is n-butylated, and the high-n-butylated melamine-aldehyde resin includes, but is not limited to: CYMEL 1156, CYMEL MB-94, CYMEL MB-98, ETERMINO 9219-97, and the like. The high-imino-n-butylated melamine-aldehyde resin distinguishes from the high-iminomethylated melamine-aldehyde resin (partially methylated and high-alkyl methylated) only in that it is a n-butylated, and the high-imino-n-butylated melamine-aldehyde resin includes, but is not limited to: CYMEL 1158, CYMEL 9212-70, ETERMINO 9216-60-1, ETERMINO 9217-70, and the like. The iso-butylated melamine-aldehyde resin includes, but is not limited to: CYMEL MI-97-IX, ETERMINO 9223-60, ETERMINO 9228-60, ETERMINO 9229-60, and the like.

In some examples, the hybrid etherified melamine-aldehyde resin includes at least one of: a high-alkylated melamine-aldehyde resin, a high-imine based melamine-aldehyde resin. The high-alkylated melamine-aldehyde resin includes, but is not limited to: CYMEL 1116, CYMEL 1130, CYMEL 1133, CYMEL 1141, CYMEL 1161. CYMEL 1168, ETERMINO 9611-98, and the like; the high-imine based melamine-aldehyde resin includes, but is not limited to: CYMEL 202. CYMEL 203, and the like.

In some examples, the melamine-aldehyde resin includes at least one of: methylated hexamethoxy melamine-aldehyde resin, partially methylated melamine-aldehyde resin, n-butylated melamine-aldehyde resin, high-n-butylated melamine-aldehyde resin, iso-butylated melamine-aldehyde resin, or high-alkylated melamine-aldehyde resin. These types of melamine-aldehyde resins are beneficial to improve the storage stability and catalytic stability of the coating composition.

Both benzoguanamine-aldehyde resin and melamine-aldehyde resin are triazine-based compounds, and the difference between the two compounds is that benzoguanamine-aldehyde resin has a triazine with benzene ring substitute. The benzoguanamine-aldehyde resin includes, but is not limited to: CYMEL 1123, CYMEL 659, CYMEL 5010, ETERMINO 9411-75, ETERMINO 94112-75, ETERMINO 9412-70, and the like.

The urea-aldehyde resin, also known as urea-formaldehyde resin (UF) resin, refers to a thermoset resin obtained by reacting formaldehyde with urea. In some exemplary implementations, the urea-aldehyde resin includes at least one of: a high-solid urea-aldehyde resin, or a butylated urea-aldehyde resin. The butylated urea-aldehyde resin includes at least one of a n-butylated urea-aldehyde resin, or an iso-butylated urea-aldehyde resin.

In some examples, the high-solid urea-aldehyde resin includes, but is not limited to: CYMEL U-65, CYMEL U-15, CYMEL U-80, and the like. The n-butylated urea-aldehyde resin includes, but is not limited to: CYMEL U-21-511, CYMEL U-21-510, CYMEL U-93-210, CYMEL U-216-LF, CYMEL U-227-8, CYMEL U-1050-10, CYMEL U-1052-8, CYMEL U-1054, CYMEL UB-25-BE, CYMEL UB-30-B, ETERMINO 9112-60, ETERMINO 9115-60-2, ETERMINO 91152-70, and the like. The iso-butylated urea-aldehyde resin includes, but is not limited to: CYMEL U-662, CYMEL U-663, CYMEL U-1051, CYMEL UI-19-1, CYMEL UI-21-E, CYMEL CYMEL UI-38-1, CYMEL UI-20-E, ETERMINO 9121-60, ETERMINO 9122-60, ETERMINO 9123-60, and the like.

It has been found that when adopting the above kinds of the amino resins as the crosslinking agent D of the present disclosure, the anti-reflection coating composition provided in the embodiments of the present disclosure can have a better storage stability, and the crosslinking agent D can undergo a cross-linking and curing reaction with the matting resin A upon being heated under a temperature ranging from 80° C. to 250° C. In addition, it has been found that when the urea-aldehyde resin or the glycoluril-aldehyde resin is used alone, the undercut phenomenon will occur at the bottom of the photoresist pattern, causing poor quality of the photoresist pattern. When the melamine-aldehyde resin is used alone, the crosslinking effect of the coating composition will be bad, such that the formed coating material has poor resistance to solvent and tends to slightly mix with the photoresist as coated. Thus, the surface of the photoresist pattern as finally obtained will be not uniform, which will be difficult to completely eliminate the standing waves.

In some exemplary implementations, the crosslinking agent D of the present disclosure is a mixture of a first crosslinking agent D1 and a second crosslinking agent D2. The first crosslinking agent D1 includes at least one of glycoluril-aldehyde resin, or urea-aldehyde resin, and the second crosslinking agent D2 includes at least one of melamine-aldehyde resin, or benzoguanamine-aldehyde resin.

It has been found that when a group consisting of at least one of glycoluril-aldehyde resin or urea-aldehyde resin, and at least one of melamine-aldehyde resin or benzoguanamine-aldehyde resin is used as the crosslinking agent D of the present disclosure, the solubility of the coating prepared by mixing and crosslinking the matting resin A and such type of crosslinking agent D shows a significant difference before and after curing. There is no mix between the coating and the photoresist, and the coating will not dissolve in a base solvent of the photoresist (the base solvent is a solvent used when preparing the photoresist). The coating can further eliminate the standing waves and undercut generated in the photoresist pattern and a better photoresist pattern can be obtained.

Thus, when the mixture of the first crosslinking agent D1 and the second crosslinking agent D2 is used as the crosslinking agent D of the present disclosure, through the synergistic effects of the crosslinking agent D with other components in the anti-reflection coating composition, the undercut in the photoresist can be significantly alleviated, this is because: the melamine-aldehyde resin, such as, hexamethoxy melamine-aldehyde resin, has some degree of alkalinity and can cure the acid within the formed BARC layer when baking and cross-linking the anti-reflection coating composition, which can prevent acid from diffusing into the photoresist as coated (the spill of acid may cause the removal of protective groups of the photoresist at the interface between the photoresist and the BARC layer, which makes the photoresist easy to dissolve in the alkaline developer before the exposure, and thus have a poor dissolution resistance effect).

In some examples, in the crosslinking agent D of the present disclosure, the weight ratio of the first crosslinking agent D1 to the second crosslinking agent D2 is between 1:1 and 9:1, including, but not limited to: 1:1, 2:1, 3:1, 4:1, 5:1, 6:1, 7:1, 8:1, 9:1, and the like. Further, the weight ratio of the first crosslinking agent D1 to the second crosslinking agent D2 is between 2:1 and 5:1.

In some exemplary implementations of the present disclosure, the weight percentage of the crosslinking agent Din the active component may range from 3 wt % to 40 wt %. When adopting the crosslinking agent D within the above weight percentage range, it can ensure that the BARC layer has a suitable crosslinking degree, such that the time used in removing the BARC layer in the plasma asking removal process will be relatively short, which can avoid the formation of the wafer defect resulted from the unremovable residue. Furthermore, by adopting the crosslinking agent D within the above weight percentage range, it can further ensure that the BARC layer resists the elution of the photoresist solvent after being cured. In some examples of the present disclosure, the weight percentage of the crosslinking agent D in the active component ranges from 8 wt % to 25 wt %, including, but not limited to, such as, 8 wt %, 10 wt %, 15 wt %, 18 wt %, 20 wt %, 22 wt %, 25 wt %, and the like.

Solvent B

The solvent B used in the embodiments of the present disclosure primarily has the function of dispersing the one or more resins, facilitating the coating function and improving the uniformity of the coating as obtained. In some embodiments, the solvent B includes, but is not limited to, at least one member selected from the group consisting of propylene glycol methyl ether acetate, propylene glycol methyl ether, cyclopentanone, cyclohexanone, ethyl lactate, ethyl 3-ethoxypropionate, diethylene glycol monobutyl ether, or methyl ether. In some embodiments of the present disclosure, the weight percentage of the solvent B in the anti-reflection coating composition ranges from 80 wt % to 99 wt %, including but not limited to, 80 wt %, 82 wt %, 84 wt %, 86 wt %, 88 wt %, 90 wt %, 92 wt %, 94 wt %, 96 wt %, 99 wt %, and the like. In some examples, the weight percentage of the solvent B in the anti-reflection coating composition ranges from 90 wt % to 95 wt %.

The anti-reflection coating compositions provided in the embodiments of the present disclosure at least have the following benefits.

(1) Through the synergistic effects among the matting resin A and other components, the anti-reflection coating composition provided in the present disclosure can undergo crosslinking and curing reaction to form a BARC layer with a great coating quality. Such BARC layer can strongly absorb light radiation ranging from 100 nm to 300 nm, especially has a strong absorption at 248 nm. The extinction coefficient thereof is greater than 0.4, further greater than 0.5, which allows for the use of a thinner BARC layer, and in turn allows for shorter etching time and easier clearance. The BARC layer further possesses improved etching performance, and the excessive loss of photoresist layer in the unexposed region can be avoided during the etching process. Thus the pattern can be precisely transferred from the photoresist layer to the substrate, thereby obtaining a high-precision photoresist pattern. In addition, the shorter etching time of the BARC layer makes the BARC layer suitable for use in a thin-layer photoresist to generate a high-resolution photoresist pattern.

(2) The BARC layer prepared from the anti-reflection coating composition provided in the present disclosure is suitable for matching the photoresist of which the exposure light source is a light source of 248 nm excited by KrF, which greatly eliminates the adverse effect of diffraction and reflection between the bottom of the photoresist and the substrate (e.g., silicon wafer) on the quality of the photoresist pattern in the deep ultraviolet photolithography process.

(3) The anti-reflection coating composition provided in the present disclosure, through the interaction among the respective active components, can eliminate interference effect inside the photoresist, avoid the standing waves and energy swing curve at the photoresist sidewall, eliminate energy-window instability and undercut effect due to the unevenness of the substrate, improve the control on the feature dimension, expand the process window of the photolithography process, and improve the process tolerance level of the photoresist exposure dose.

(4) The anti-reflection coating composition, by using the catalyst C and the crosslinking agent D provided in the examples of the present disclosure to cooperate with the matting resin A, shows great storage stability that can be stably stored for 8-12 months prior to use. Furthermore, the solubility of the coating formed after the curing of the anti-reflection coating composition provided in the embodiments of the present disclosure shows a significant difference from the solubility of the coating before the curing, which ensures that the BARC layer does not mix with the photoresist, and is particularly suitable for high-quality device with a feature dimension of less than 0.3 μm.

According to another aspect of the embodiments of the present disclosure, use or an application of any of the anti-reflection coating compositions as described above is further provided, for example, the use or application may be use or application of the anti-reflection coating composition in a photo lithographic process.

According to yet another aspect of the embodiments of the present disclosure, a coating is further provided, and the coating includes a bottom anti-reflection coating layer and a photoresist layer. The bottom anti-reflection coating layer is formed by applying any of the anti-reflection coating compositions described above on a substrate. The photoresist layer is formed on the bottom anti-reflection coating layer.

According to yet still another aspect of the embodiments of the present disclosure, a coating product is further provided, and the coating product includes a substrate and a coating. A bottom anti-reflection coating of the coating is disposed on the substrate as shown above.

In some examples, the substrate includes a silicon wafer, a glass, an aluminum oxide substrate, a silicon carbide substrate, a gallium nitride substrate, a zinc oxide substrate, or an aluminum nitride. The silicon wafer and the glass may further be a silicon wafer and a glass with a coating film thereon.

Detailed description of the present disclosure is further made through specific embodiments as follows. It should be noted that the following examples are merely used to further illustrate the present disclosure, and should not be construed as a limitation on the protection scope of the present disclosure. Non-essential modifications and adaptations may be made by persons of ordinary skill in the art based on the content the present disclosure, and should still be included within the protection scope of the present disclosure.

The following Examples and Comparative Examples provide different anti-reflection coating compositions respectively, and the formulations of these anti-reflection coating compositions are listed in Table 1, in which the weights in grams are provided for the different components.

TABLE 1

|  | Matting Resin A | Catalyst C | Crosslinking Agent D | | Solvent B | |
| --- | --- | --- | --- | --- | --- | --- |
| Example 1 | GMA/HPMA/ Anthracene-9-carboxylic acid (molar ratio of 1:1:1) (Weight average molecular weight of 20000) | pyridinium p-toluenesulfonate | glycoluril-aldehyde resin CYMEL 1172 | hexamethoxy methylmelamine CYMEL 303 LF | propylene glycol methyl ether | propylene glycol methyl ether acetate |

TABLE 1-continued

|  | Matting Resin A | Catalyst C | Crosslinking Agent D | | Solvent B | |
| --- | --- | --- | --- | --- | --- | --- |
| weight/g Example 2 | 20.8 GMA/HPMA/ Anthracene-9-carboxylic acid (molar ratio of 1:2:1) (Weight average molecular weight of 10000) | 1.2 pyridinium p-toluenesulfonate | 2.4 glycoluril-aldehyde resin CYMEL U-80 | 0.6 hexamethoxy methylmelamine CYMEL 300 | 150 propylene glycol methyl ether | 450 propylene glycol methyl ether acetate |
| weight/g Example 3 | 15 GMA/HPMA/ Anthracene-9-carboxylic acid (molar ratio of 1:0.33:1) (Weight average molecular weight of 6000) | 3 ammonium p-toluenesulfonate | 6 glycoluril-aldehyde resin CYMEL UM-15 | 1 hexamethoxy methylmelamine CYMEL 350 | 350 propylene glycol methyl ether | 1000 propylene glycol methyl ether acetate |
| weight/g Example 4 | 22 GMA/HPMA/ Anthracene-9-carboxylic acid (molar ratio of 1:0.4:0.9) (Weight average molecular weight of 15000) | 0.5 sodium p-toluenesulfonate | 1.8 glycoluril-aldehyde resin CYMEL U-65 | 0.2 hexamethoxy methylmelamine CYMEL 304 | 100 cyclohexanone | 300 propylene glycol methyl ether acetate |
| weight/g Example 5 | 20.8 GMA/HPMA/ Anthracene-9-carboxylic acid (molar ratio of 1:0.33:0.9) (Weight average molecular weight of 18000) | 1.2 pyridinium p-toluenesulfonate | 2.4 glycoluril-aldehyde resin CYMEL 1170 | 0.6 hexamethoxy methylmelamine CYMEL 308 | 150 propylene glycol methyl ether | 450 ethyl 3-ethoxypropionate |
| weight/g Comparative Example 1 | 22 GMA/HPMA/ Anthracene-9-carboxylic acid (molar ratio of 1:6:1) (Weight average molecular weight of 4000) | 0.5 p-toluenesulfonic acid | 1.8 glycoluril-aldehyde resin CYMEL 1170 | 0.2 | 150 propylene glycol methyl ether | 450 ethyl 3-ethoxypropionate |
| weight/g Comparative Example 2 | 22 GMA/HPMA/ Anthracene-9-carboxylic acid (molar ratio of 1:6:1) (Weight average molecular weight of 25000) | 0.5 p-toluenesulfonic acid | 2.0 glycoluril-aldehyde resin CYMEL 1170 | | 150 propylene glycol methyl ether | 450 ethyl 3-ethoxypropionate |

TABLE 1-continued

|  | Matting Resin A | Catalyst C | Crosslinking Agent D | Solvent B | |
| --- | --- | --- | --- | --- | --- |
| weight/g | 22 | 0.5 | 2.0 | 150 | 450 |
| Comparative Example 3 | GMA/HPMA/ Anthracene-9-carboxylic acid (molar ratio of 1:7:1) (Weight average molecular weight of 30000) | p-toluenesulfonic acid | glycoluril-aldehyde resin CYMEL 1170 | propylene glycol methyl ether | ethyl 3-ethoxypropionate |
| weight/g | 22 | 0.5 | 2.0 | 150 | 450 |

In Table 1, GMA represents glycidyl methacrylate, and HPMA represents hydroxypropyl methacrylate.

The BARC layers prepared from the above anti-reflection coating compositions are subjected to a performance test, and parameters and results of the performance test are shown in Table 2 and Table 3:

1. The Extinction Coefficient K, and Morphology of the Photoresist Sidewall

The thickness of each coating described in Table 2 is the thicknesses of the respective BARC layer in the case that no standing wave is observed in the photoresist, wherein the thickness of the coating is simulated and determined by the exposure wavelength, the inherent performance of the photoresist, and the light absorption performance of the anti-reflection coating. In the Examples of the present disclosure, it is desired that the thickness of the coating is less than 90 nm. Further, the desired coating thickness is less than 60 am. The photoresist involved in the morphology performance test of the photoresist sidewall may be any type of photoresist used in the semiconductor industry, so long as the light activated substance in the photoresist and anti-reflection coating composition can absorb the light at the exposure wavelength used in the imaging process of the photoresist. The light activated substance in the anti-reflection coating composition is the matting resin, and the light activated substance in the photoresist is a photosensitive material (e.g., a photosensitive resin or a photosensitizer).

The extinction coefficient K: the anti-reflection coating compositions provided in the Examples and Comparative Examples are each coated on a surface of a 12-inch silicon wafer, baked at 200° C. for 120 sec, and tested and analyzed by an ellipsometer at a wavelength of 248 nm to obtain the K values of the anti-reflection coatings, and the results are shown in Table 2.

The morphology of the photoresist sidewall: the anti-reflection coating compositions provided in the Examples and Comparative Examples are each spin-coated onto the surface of the 12-inch silicon wafer, baked and cross-linked at 200° C. for 120 sec to obtain the cross-linked BARC layers. The thickness of each coating is determined by the ellipsometer, and the results are shown in Table 2. Then, photoresist S602 (ShinEtsu, JP) is coated on the cured BARC layer at a speed of 1500 rpm, baked at 100° C. for 60 sec, then exposed at 53 mj/cm$^2$ using a 248-nm light source exposure, and developed by a tetramethylammonium hydroxide (TMAH) developer with a mass concentration of 2.38% for 45 sec, and the morphology of the photoresist in the obtained slice was observed with a Hitachi scanning electron microscope SU8100. The results are shown in Table 2.

Figure 2:
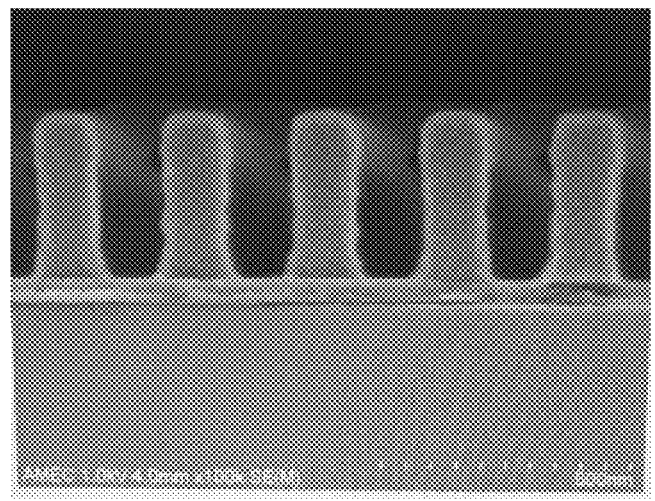
FIG. 2 is a picture showing a microscopic morphology of a slice obtained after coating a photoresist layer on a coating material prepared from the anti-reflection coating composition provided in Example 1, and then baking, exposing, and developing.
Figure 3:
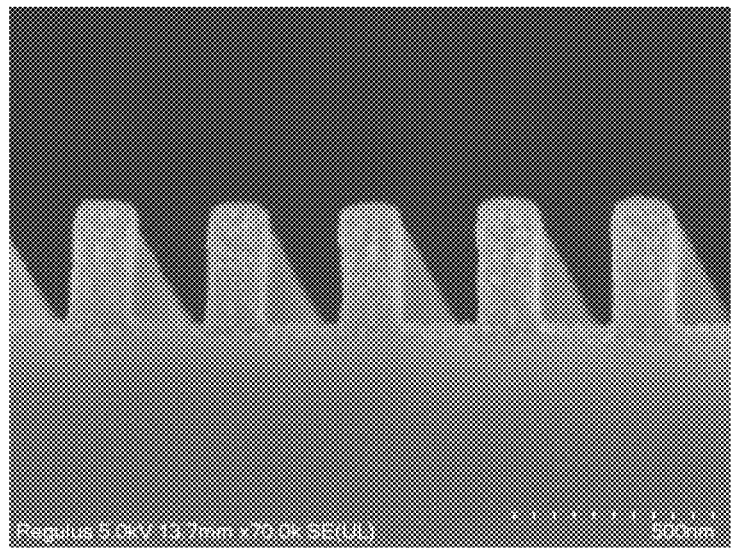
FIG. 3 is a picture showing a microscopic morphology of a slice obtained after coating a photoresist layer on a coating material prepared from the anti-reflection coating composition provided in Example 2, and then baking, exposing, and developing.
Figure 4:
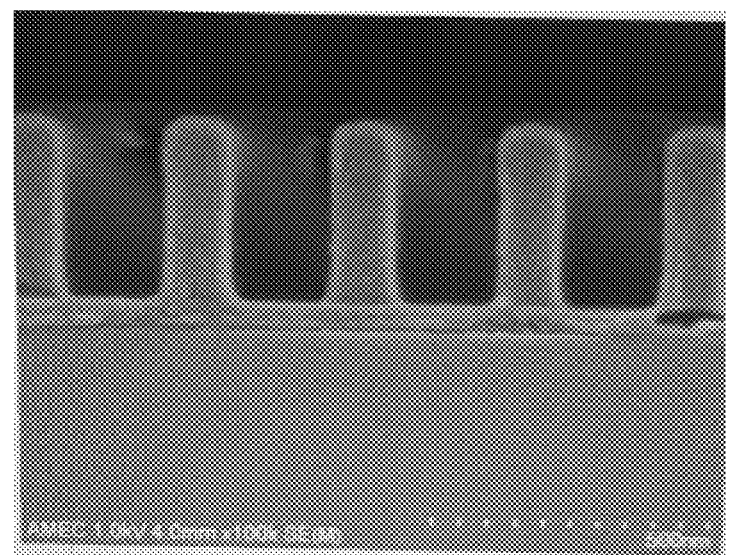
FIG. 4 is a picture showing a microscopic morphology of a slice obtained after coating a photoresist layer on a coating material prepared from the anti-reflection coating composition provided in Example 3, and then baking, exposing, and developing.
Figure 5:
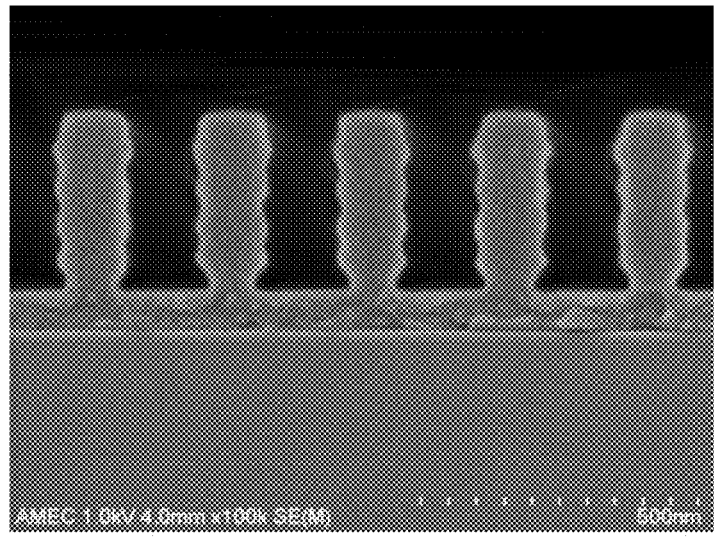
FIG. 5 is a picture showing a microscopic morphology of a slice obtained after coating a photoresist layer on a coating material prepared from the anti-reflection coating composition provided in Comparative Example 1, and then baking, exposing, and developing.
Figure 6:
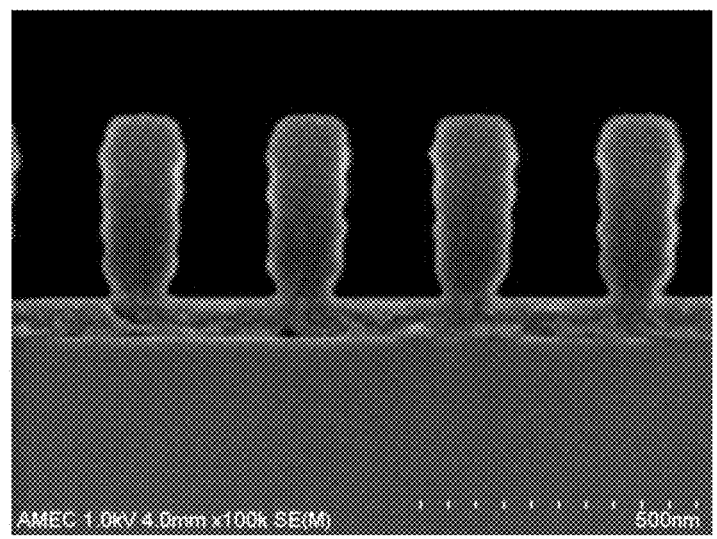
FIG. 6 is a picture showing a microscopic morphology of a slice obtained after coating a photoresist layer on a coating material prepared from the anti-reflection coating composition provided in Comparative Example 2, and then baking, exposing, and developing.
Figure 7:
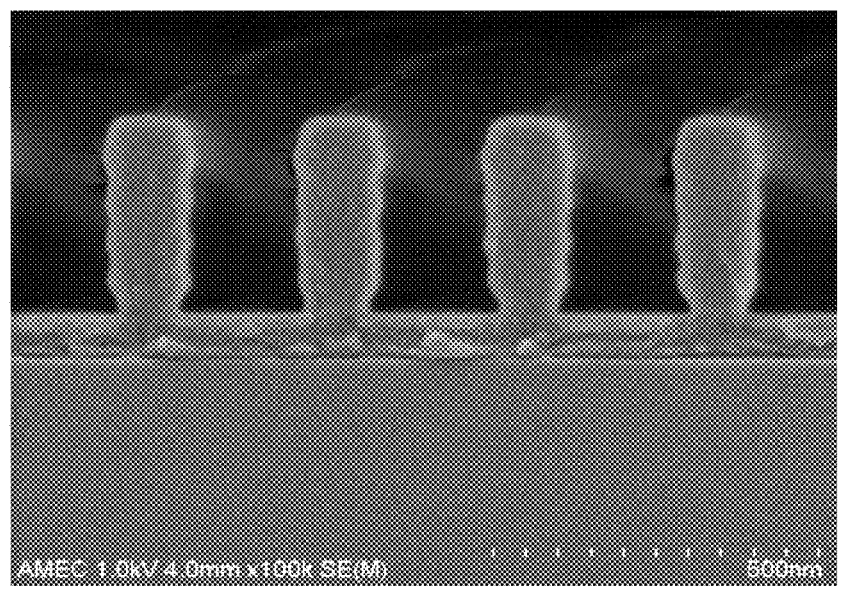
FIG. 7 is a picture showing a microscopic morphology of a slice obtained after coating a photoresist layer on a coating material prepared from the anti-reflection coating composition provided in Comparative Example 3, and then baking, exposing, and developing.

The morphology of each of the photoresists provided in Examples 1, 2, and 3 is shown in FIGS. 2, 3 and 4, respectively, and morphology of the photoresist provided in each of Comparative Examples 1, 2, and 3 is shown in FIGS. 5, 6 and 7, respectively. As can be seen from FIGS. 5, 6, and 7, the sidewalls of the photoresist patterns obtained from the BARC layers provided in Comparative Examples 1, 2, and 3 show obvious standing wave effects, and the bottom of these photoresist patterns shows an obvious undercut phenomenon. As can be clearly seen from FIGS. 2, 3, and 4, the sidewalls of the photoresist patterns obtained from the BARC layers provided in Examples 1, 2, and 3 have neither standing wave effect, nor undercut phenomenon.

TABLE 2

| | Extinction coefficient K | Thickness of Coating/nm | Morphology of Photoresist Sidewall |
| --- | --- | --- | --- |
| Example 1 | 0.50 | 54 | The standing waves are completely eliminated, and no undercut exists |
| Example 2 | 0.45 | 60 | The standing waves are completely eliminated, and no undercut exists |
| Example 3 | 0.68 | 36 | The standing waves are completely eliminated, and no undercut exists |
| Example 4 | 0.60 | 43 | The standing waves are completely eliminated, and no undercut exists |
| Example 5 | 0.63 | 40 | The standing waves are completely eliminated, and no undercut exists |
| Comparative Example 1 | 0.32 | 100 | The standing waves are not completely eliminated, and the undercut exists |

TABLE 2-continued

| | Extinction coefficient K | Thickness of Coating/nm | Morphology of Photoresist Sidewall |
|---|---|---|---|
| Comparative Example 2 | 0.32 | 100 | The standing waves are not completely eliminated, and the undercut exists |
| Comparative Example 3 | 0.30 | 100 | The standing waves are not completely eliminated, and the undercut exists |

As can be seen from Table 2, in Comparative Examples 1 to 3, the BARC layers prepared from mixing the matting resins having low content of anthracene-9-carboxylic acid with other components have low extinction coefficients, even if the thicknesses of these BARC layers are greater than 90 nm, or even up to 100 nm, the standing waves at the sidewalls of the photoresists cannot be completely eliminated. In contrast, in Examples 1 to 5, by mixing the matting resins having a desired content range of anthracene-9-carboxylic acid with other components, the BARC layers as obtained all have extinction coefficients of greater than 0.5, and the thicknesses of the coatings can be as low as less than 65 nm, further less than 55 nm. In this case, the standing waves at the photoresist sidewalls can be completely eliminated and excellent photoresist patterns can be obtained. In addition, the BARC layers obtained in Examples 1 to 5 of the present disclosure can further significantly alleviate the undercut phenomenon at the bottom of the photoresist patterns, whereas in the BARC layers obtained by merely adopting the glycoluril-aldehyde resin as a crosslinking agent to mix with other components in Comparative Examples 1 to 3, an obvious undercut phenomenon exists at the bottom of each of the photoresist patterns.

2, the Etching Selectivity, and the Elution Resistance

The etching selectivity: the anti-reflection coating composition provided in each of the Examples and Comparative Examples is subjected to a rotary evaporation to obtain a composition with a solid content of 10%, which is then spin-coated onto a surface of a 12-inch silicon wafer, and baked and cross-linked at 200° C. for 120 sec to obtain a BARC layer. The thickness of the BARC layer is determined as 300 nm by ellipsometer. A dry etch with a plasma etcher NLD-570 using $CF_4/O_2$ plasma in a molar ratio of 2:1 is performed for 20 sec. and the thickness of the BARC layer post the etch is further determined. The difference between the thicknesses of the BARC layer before and after etching is the etched film thickness.

The data with regard to the etching selectivity in Table 3 is provided relative to a deep ultraviolet photoresist material, poly(p-hydroxystyrene). The etching selectivity is calculated as the etched thickness of BARC layer/the etched thickness of photoresist material layer under the same condition, and the test results are shown in Table 3.

The elution resistance: the BARC layers provided in the Examples and Comparative Examples are respectively soaked in propylene glycol methyl ether acetate, propylene glycol methyl ether, and ethyl lactate solvent for 10 min, and whether there is any change in the thickness and the surface of each BARC layer is determined. Where there is no change determined for a BARC layer, it indicates that the BARC layer has a highly different solubility after curing, is not easy to be dissolved in the base solvent of the photoresist, and does not mix with the photoresist. The test results are shown in Table 3.

TABLE 3

| | Etching Selectivity | Elution Resistance |
|---|---|---|
| Example 1 | 1.51 | There is no change in terms of the thickness and the surface of the cross-linked film layer |
| Example 2 | 1.58 | There is no change in terms of the thickness and the surface of the cross-linked film layer |
| Example 3 | 1.65 | There is no change in terms of the thickness and the surface of the cross-linked film layer |
| Example 4 | 1.54 | There is no change in terms of the thickness and the surface of the cross-linked film layer |
| Example 5 | 1.53 | There is no change in terms of the thickness and the surface of the cross-linked film layer |
| Comparative Example 1 | 1.55 | The thickness of the cross-linked film layer obviously gets thinner, with a loss of 120 Å, and there is a change in the surface of the cross-linked film layer |
| Comparative Example 2 | 1.10 | There is no change in terms of the thickness and the surface of the cross-linked film layer |
| Comparative Example 3 | 1.08 | There is no change in terms of the thickness and the surface of the cross-linked film layer |

As can be seen from Table 3, the anti-reflection coating compositions provided in Examples 1 to 5 of the present disclosure adopt matting resins A with a molecular weight ranging from 6000 to 20000, and the BARC layers prepared by mixing such matting resins A with other components show an improved plasma etching rate relative to the photoresist material. The etching selectivity of each of these BARC layers relative to the deep ultraviolet photoresist material poly(p-hydroxystyrene) is greater than 1.5, and such BARC layers can allow for a shorter etching time, avoiding excessive loss of the photoresist film in the unexposed region during the etching process. In this way, the image can be completely transferred onto the substrate, thereby obtaining a great photoresist pattern. In this case, the BARC layers can retain a good elution resistance performance and resist the elution of the photoresist solvent without mixing with the photoresist material.

However, the BARC layers provided in Comparative Examples 1 to 3 cannot possess the fast etching performance and the great elution resistance performance simultaneously. Specifically, the BARC layer in Comparative Example 1 is obtained by mixing the matting resin with a molecular weight of 4000 (a molecular weight below 6000) with other components. Although this BARC layer shows an improved etching rate, the elution resistance performance is worse, and thus this layer has a poor resistance to photoresist solvent, and is likely to mix with the photoresist material on the layer. Thus, it is difficult to achieve the effect of eliminating the standing waves at the sidewall of the photoresist pattern. The BARC layers in Comparative Examples 2 and 3 are obtained by mixing the matting resin with a molecular weight of greater than 20,000 with other components, and the etching rates of these BARC layers are comparable to the etching rate of the photoresist material layer, resulting in severe corrosion of the photoresist in the protected unexposed region, which in turn causes the damage to the photoresist pattern or inaccurate transfer to the substrate.

3. The storage stability: after storing the anti-reflection coating compositions provided in the Examples and Comparative Examples for 10 months in a room under a constant temperature, by following the same method as the testing method for extinction coefficient K and photoresist sidewall morphology, the anti-reflective coating compositions are each spin-coated on the surface of the silicon wafer, baked and cross-linked to form a coating. Then, 49 sampling points are taken from the coating, the thickness of the coating is measured at the 49 sampling points, and the uniformity of film thickness is calculated as: (maximum film thickness−minimum film thickness)/(maximum film thickness+minimum film thickness)*100%. Where the uniformity of film thickness is less than 1%, it means that the storage stability of the coating is good, that is, the anti-reflection coating composition can be stored for a relatively long period of time prior to use. The test results are shown in Table 4.

As can be seen from Table 4, based on the anti-reflection coating compositions in Examples 1 to 5 of the present disclosure, the BARC obtained by mixing the organic acid salt of the present disclosure as the catalyst with other components has great storage stability, and can be stably stored for a longer period prior to use. In Comparative Examples 1 to 3, the coating composition is obtained by mixing the organic acid as the catalyst with other components, and the uniformity of the film thickness of the BARC formed after curing for a storage period of 10 months is poor, illustrating that the coating composition provided in Comparative Examples 1 to 3 is difficult to stably store for a longer period.

TABLE 4

| | Uniformity of Film Thickness |
|---|---|
| Example 1 | 0.5% |
| Example 2 | 0.35% |
| Example 3 | 0.25% |
| Example 4 | 0.2% |
| Example 5 | 0.1% |
| Comparative Example 1 | 8% |
| Comparative Example 2 | 8% |
| Comparative Example 3 | 8% |

In summary, it can be seen from the test results shown in Table 2 to Table 4 that, in the anti-reflection coating compositions provided by the embodiments of the present disclosure, through the synergistic effects among the above matting resins A, the crosslinking agents D and the catalysts C used in the Examples of the present disclosure and by mixing the corresponding components with the solvent B, the BARC layers as obtained can strongly absorb radiation ranging from 100 nm to 300 nm, thereby greatly eliminating the adverse effects of diffraction and reflection between the bottom of the photoresist and the silicon wafer on the quality of the photoresist pattern during the photolithographic process. Particularly, the BARC layers show a great light absorption performance at 248 nm and have an extinction coefficient of higher than 0.4 or even more than 0.5, which allows for a thinner BARC layer used in the photolithography process and in turn a shorter etching time, and such BARC layers are particularly suitable for obtaining a high-resolution photoresist pattern in a thin layer of photoresist.

Further, the BARC layers obtained from the anti-reflection coating compositions provided by the embodiments of the present disclosure possess an improved plasma etching rate relative to the photoresist material, thereby avoiding the excessive loss of the photoresist film in the unexposed region during the etching process, which facilitates the complete transfer of the image onto the substrate to obtain a great photoresist pattern.

The anti-reflection coating compositions provided in the embodiments of the present disclosure further possess great storage stability and a great difference in the solubilities before and after curing, or other characteristics, and has a longer storage life. Due to the great storage stability of the anti-reflection coating compositions, the compositions can be stably stored for a long period of time prior to use, and still maintain a great uniformity in film thickness after the long period of time. The great difference in the solubilities of the anti-reflection coating compositions before and after curing imparts better elution resistance to the coating and make it be capable of withstanding the elution of the photoresist solvent without mixing with the photoresist material.

The above embodiments are merely example embodiments to illustrate that the anti-reflection coating compositions of the present disclosure can realize improvements in light absorption performance, etching selectivity, elution resistance performance, and storage stability when adopting the components and ratio ranges of the present disclosure, and are not intended to limit the protection scope of the present disclosure. Thus, the implementations of the present disclosure are not limited to the specific types and specific contents of the components provided by the above embodiments. Several modifications may further be made by those of ordinary skill in the art without departing from the principles of the present disclosure, and these improvements should be construed as falling within the protection scope of the disclosure.

The foregoing embodiments are merely illustrative and are used to explain some features of the methods of the present disclosure described herein. The appended claims are intended to cover as broadly scope as possible that can be envisaged, and the embodiments herein are merely illustrative of implementations selected from all possible combinations of the embodiments. Therefore, the intention of the applicant is that the appended claims are not limited by the selection of the embodiments of the present disclosure that are illustrative of the features of the present disclosure. Some numerical ranges used in the claims further include sub-ranges within them, and changes in the ranges should further be interpreted as being covered by the appended claims when possible.

What is claimed is:

1. An anti-reflection coating composition, comprising:
   an active component with a weight percentage from 1 wt % to 20 wt % and a solvent B with a weight percentage from 80 wt % to 99 wt %;
   wherein the active component comprises a matting resin A with a weight percentage from 50 wt % to 95 wt %, a catalyst C with a weight percentage from 1 wt % to 20 wt %, and a crosslinking agent D with a weight percentage from 3 wt % to 40 wt %;
   wherein the matting resin A is prepared by acrylic resin and a chromophoric compound, and a weight average molecular weight of the matting resin A ranges from 6000 to 20000;
   wherein polymerization monomers of the acrylic resin comprise epoxy-containing or hydroxyl-containing acrylate monomers A21;
   wherein a molar ratio of A21 to the chromophoric compound is between 1:0.8 and 1:1;
   wherein the catalyst C is an organic acid salt; and
   wherein the crosslinking agent D comprises a mixture of at least one member selected from a group consisting of melamine-aldehyde resin, or benzoguanamine-aldehyde resin and at least one member selected from a group consisting of glycoluril-aldehyde resin, or urea-aldehyde resin; and a weight ratio of at least one member selected from a group consisting of glycoluril-aldehyde resin, or urea-aldehyde resin to at least one member selected from a group consisting of melamine-aldehyde resin, or benzoguanamine-aldehyde resin is between 1:1 and 9:1.

2. The anti-reflection coating composition according to claim 1, wherein polymerization monomers of the acrylic resin are same acrylate monomers.

3. The anti-reflection coating composition according to claim 1, wherein polymerization monomers of the acrylic resin comprise different acrylate monomers.

4. The anti-reflection coating composition according to claim 3, wherein the polymerization monomers of the acrylic resin comprise at least one of epoxy-containing or hydroxyl-containing acrylate monomers A21, and at least one of hydroxyl-containing acrylate monomers A22, and wherein A21 and A22 are different.

5. The anti-reflection coating composition according to claim 4, wherein a molar ratio of A21 to A22 is between 1:0.1 and 1:5.

6. The anti-reflection coating composition according to claim 3, wherein the polymerization monomers of the acrylic resin comprise at least one of epoxy-containing or hydroxyl-containing acrylate monomers A21, and at least one of acrylate monomers A23 free of both hydroxyl group and epoxy group.

7. The anti-reflection coating composition according to claim 6, wherein a molar ratio of A21 to A23 is between 1:0.1 and 1:5.

8. The anti-reflection coating composition according to claim 1, wherein the chromophoric compound comprises at least one member selected from a group consisting of naphthalene or derivatives thereof, anthracene or derivatives thereof, coumarin or derivatives thereof, fluorescein or derivatives thereof, rhodamine, eosin, perylene or derivatives thereof, fluorene or derivatives thereof, stilbene or derivatives thereof, or phenanthrene or derivatives thereof.

9. The anti-reflection coating composition according to claim 1, wherein the organic acid salt comprises at least one member selected from a group consisting of p-toluenesulfonate, dodecylbenzene sulfonate, oxalate, phthalate, or naphthalene sulfonate.

10. Use of the anti-reflection coating composition as defined in claim 1 in a photoresist process, wherein the anti-reflection coating composition is used to form a bottom anti-reflection coating layer on a substrate.

11. The use of the anti-reflection coating composition according to claim 10, polymerization monomers of the acrylic resin comprise at least one kind of acrylate monomer.

12. The use of the anti-reflection coating composition according to claim 10, wherein polymerization monomers of the acrylic resin comprise same acrylate monomers.

13. The use of the anti-reflection coating composition according to claim 10, wherein polymerization monomers of the acrylic resin comprise different acrylate monomers.

14. The use of the anti-reflection coating composition according to claim 13, wherein the polymerization monomers of the acrylic resin comprise at least one of epoxy-containing or hydroxyl-containing acrylate monomers A21, and at least one of hydroxyl-containing acrylate monomers A22, and wherein A21 and A22 are different.

15. The use of the anti-reflection coating composition according to claim 14, wherein a molar ratio of A21 to A22 is between 1:0.1 and 1:5.

16. The use of the anti-reflection coating composition according to claim 13, wherein the polymerization monomers of the acrylic resin comprise at least one of epoxy-containing or hydroxyl-containing acrylate monomers A21, and at least one of acrylate monomers A23 free of both hydroxyl group and epoxy group.

17. The use of the anti-reflection coating composition according to claim 16, wherein a molar ratio of A21 to A23 is between 1:0.1 and 1:5.

18. The use of the anti-reflection coating composition according to claim 10, wherein the chromophoric compound comprises at least one member selected from a group consisting of naphthalene or derivatives thereof, anthracene or derivatives thereof, coumarin or derivatives thereof, fluorescein or derivatives thereof, rhodamine, eosin, perylene or derivatives thereof, fluorene or derivatives thereof, stilbene or derivatives thereof, or phenanthrene or derivatives thereof.

19. The use of the anti-reflection coating composition according to claim 10, wherein the organic acid salt comprises at least one member selected from a group consisting of p-toluenesulfonate, dodecylbenzene sulfonate, oxalate, phthalate, or naphthalene sulfonate.

20. The anti-reflection coating composition according to claim 1, wherein polymerization monomers of the acrylic resin comprise at least one kind of acrylate monomer.

* * * * *

UNITED STATES PATENT AND TRADEMARK OFFICE
CERTIFICATE OF CORRECTION

| | |
|---|---|
| PATENT NO. | : 11,767,435 B2 |
| APPLICATION NO. | : 17/560776 |
| DATED | : September 26, 2023 |
| INVENTOR(S) | : Yun Zhang |

It is certified that error appears in the above-identified patent and that said Letters Patent is hereby corrected as shown below:

On the Title Page

Column 1 Item (30) (Foreign Application Priority Data), Line 1, delete "Dec. 23, 2021" and insert -- Dec. 23, 2020 --.

In the Specification

Column 1, Line 16, delete "particula" and insert -- particular, --.

Column 1, Line 37, delete "coaling" and insert -- coating --.

Column 5, Line 28, delete "mailing" and insert -- matting --.

Column 6, Line 51, delete "ay" and insert -- may --.

Column 6, Line 51-52, delete "%. 3 wt %. 4 wt %. 5 wt %. 6 wt %. 7 wt %, 8 wt %. 9 wt %." and insert -- %, 3 wt %, 4 wt %, 5 wt %, 6 wt %, 7 wt %, 8 wt %, 9 wt %, --.

Column 6, Line 53, delete "%." and insert -- %, --.

Column 6, Line 56, delete "0" and insert -- 10 --.

Column 6, Line 57, delete "%" and insert -- %, --.

Column 7, Line 57, delete "BARE" and insert -- BARC --.

Column 8, Line 1, delete "BARE" and insert -- BARC --.

Column 8, Line 17, delete "all oxycarbonyl" and insert -- alkoxycarbonyl --.

Signed and Sealed this
Thirtieth Day of January, 2024

Katherine Kelly Vidal
*Director of the United States Patent and Trademark Office*

CERTIFICATE OF CORRECTION (continued)
U.S. Pat. No. 11,767,435 B2

Column 8, Line 52, delete "(FIRMA)," and insert -- (HPMA), --.

Column 8, Line 53, delete "(FIRMA)," and insert -- (HPMA), --.

Column 8, Line 54, delete "hydroxy ethyl" and insert -- hydroxyethyl --.

Column 8, Line 66, delete "A1))," and insert -- A1), --.

Column 9, Line 9, delete "hydroxypropylmethacrylate," and insert -- hydroxypropyl methacrylate, --.

Column 10, Line 30, delete "asking" and insert -- ashing --.

Column 11, Line 16, delete "%." and insert -- %, --.

Column 13, Line 19 (approx.), delete "1161." and insert -- 1161, --.

Column 13, Line 22 (approx.), delete "202." and insert -- 202, --.

Column 13, Line 51 (approx.), delete "U-216-LF," and insert -- U-216-10-LF, --.

Column 13, Line 57 (approx.), delete "CYMEL UI-38-1," and insert -- UI-27-EI, CYMEL UI-38-I, --.

Column 14, Line 55 (approx.), delete "Din" and insert -- D in --.

Column 14, Line 60 (approx.), delete "asking" and insert -- ashing --.

Column 19, Line 35, delete "am." and insert -- nm. --.

Column 21, Line 67, delete "sec." and insert -- sec, --.